(12) United States Patent
Cattani et al.

(10) Patent No.: US 10,498,316 B2
(45) Date of Patent: Dec. 3, 2019

(54) AUTO-TUNED RAMP GENERATOR

(71) Applicant: STMICROELECTRONICS S.R.L., Agrate Brianza (IT)

(72) Inventors: Alberto Cattani, Cislago (IT); Alessandro Gasparini, Cusano Milanino (IT); Alessandro Bertolini, Vermiglio (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 12 days.

(21) Appl. No.: 15/873,270

(22) Filed: Jan. 17, 2018

(65) Prior Publication Data
US 2019/0222204 A1 Jul. 18, 2019

(51) Int. Cl.
*H03K 4/90* (2006.01)
*H03K 3/023* (2006.01)
*H03K 3/011* (2006.01)
*H03K 4/501* (2006.01)

(52) U.S. Cl.
CPC .............. *H03K 4/90* (2013.01); *H03K 3/011* (2013.01); *H03K 3/023* (2013.01); *H03K 4/501* (2013.01)

(58) Field of Classification Search
CPC .......... H03K 3/00; H03K 3/011; H03K 3/023; H03K 4/00; H03K 4/06; H03K 4/20; H03K 4/50; H03K 4/501; H03K 4/56; H03K 4/58; H03K 4/90
USPC ........................................................ 327/137
See application file for complete search history.

(56) References Cited

U.S. PATENT DOCUMENTS

| 2010/0289548 | A1* | 11/2010 | Cheng | H03K 4/502 327/176 |
| 2013/0293210 | A1* | 11/2013 | Smith | H02M 3/1584 323/282 |
| 2018/0109176 | A1* | 4/2018 | Harder | H02M 1/44 |

* cited by examiner

*Primary Examiner* — Lincoln D Donovan
*Assistant Examiner* — Dave Mattison
(74) *Attorney, Agent, or Firm* — Seed IP Law Group LLP

(57) ABSTRACT

An auto-tuned ramp generator and a method for generating a sawtooth signal are provided. In the method and apparatus, a sawtooth signal is compared to a first reference voltage and a second reference voltage. In response to determining that the sawtooth signal does not exceed the first reference voltage, the voltage level of the sawtooth signal is increased. In response to determining that the sawtooth signal exceeds the second reference voltage, the voltage level of the sawtooth signal is decreased. The voltage level the sawtooth signal is retained if the sawtooth signal remains between the first and second reference voltages.

18 Claims, 4 Drawing Sheets

AUTO-TUNED RAMP GENERATOR

BACKGROUND

Technical Field

This application is directed to a ramp or sawtooth signal generator and, in particular, a ramp or sawtooth signal generator that generates a sawtooth signal exhibiting consistent properties, such as peak voltage.

Description of the Related Art

Ramp generators are ubiquitous in power regulation and control circuits including controllers for converters, such as buck, boost or buck-boost DC-DC converters. Many converter controllers are "output level responsive," and, accordingly, maintain a converter output at a desired level by responding to deviations in the output level and producing a change in the output that is opposite to the deviation. A converter controller may utilize a sawtooth signal in controlling the converter.

The accuracy of the sawtooth signal affects the operation of the controller. For example, deviations in the peaks of the sawtooth signal result in inconsistent regulation. The sawtooth signal is susceptible to process spreads, frequency changes, power supply variations, temperature variations and post-production factors, such as aging and soldering. It is, accordingly, desirable to have an auto-tuned ramp or sawtooth generator that can generate a sawtooth signal that is variation-resistant and has consistent properties, such as peak voltage.

BRIEF SUMMARY

In an embodiment, a sawtooth signal generator includes a sawtooth signal generation stage configured to: receive a control signal; and generate a sawtooth signal based on the control signal. In an embodiment, the sawtooth signal generator includes a first comparator configured to: receive a first reference voltage; receive the sawtooth signal; compare the sawtooth signal with the first reference voltage; and output a first comparison signal that is asserted when the sawtooth signal exceeds the first reference voltage and deasserted when the sawtooth signal does not exceed the first reference voltage. In an embodiment, the sawtooth signal generator includes a second comparator configured to: receive a second reference voltage; receive the sawtooth signal; compare the sawtooth signal with the second reference voltage; and output a second comparison signal that is asserted when the sawtooth signal exceeds the second reference voltage and deasserted when the sawtooth signal does not exceed the second reference voltage. In an embodiment, the sawtooth signal generator includes control logic configured to: receive the first and second comparison signals; determine whether the first comparison signal is deasserted; in response to determining that the first comparison signal is deasserted, output the control signal commanding the sawtooth signal generation stage to increase a voltage level of the sawtooth signal; determine whether the second comparison signal is asserted; and in response to determining that the second comparison signal is asserted, output the control signal commanding the sawtooth signal generation stage to decrease the voltage level of the sawtooth signal.

In an embodiment, the sawtooth signal generation stage includes: a current source having a control terminal configured to receive the control signal, an anode coupled to a voltage supply node and a cathode coupled to a sawtooth signal output node; a capacitance having a first side coupled to the output of the sawtooth signal output node and a second side coupled to a ground or reference node; and a switch having a control terminal configured to receive a reset signal, a first conduction terminal coupled to the sawtooth signal output node, while a second conduction terminal coupled to the ground or reference node.

In an embodiment, the current source is configured to: receive the control signal; and adjust an output current provided at the cathode based on the control signal. In an embodiment, the control logic is configured to: receive a clock signal; and output the reset signal based on the clock signal, the reset signal when activated causes the switch to close and reset the sawtooth signal to a ground voltage of the ground node or a reference voltage of a reference node.

In an embodiment, the control logic is configured to: determine that the first comparison signal is asserted and the second comparison signal is deasserted; and in response to determining that the first comparison signal is asserted and the second comparison signal is deasserted, output the control signal commanding the sawtooth signal generation stage to retain the voltage level of the sawtooth signal. In an embodiment, the voltage level of the sawtooth signal is the peak voltage of the sawtooth signal.

In an embodiment, a controller for a converter includes a switching stage configured to: receive a feedback voltage indicative of an output voltage of the converter, and a sawtooth signal; generate a control signal based on the feedback voltage and the sawtooth signal; and output the control signal for driving the converter. In an embodiment, the controller includes a sawtooth signal generator configured to: receive a first reference voltage and a second reference voltage; determine whether a voltage level of the sawtooth signal is below the first reference voltage or greater than the second reference voltage; in response to determining that the voltage level of the sawtooth signal is below the first reference voltage, cause the voltage level of the sawtooth signal to increase; and in response to determining that the voltage level of the sawtooth signal is greater than the second reference voltage, cause the voltage level of the sawtooth signal to decrease.

In an embodiment, the sawtooth signal generator is configured to: determine whether the voltage level of the sawtooth signal is between the first reference voltage and the second reference voltage; in response to determining that the voltage level of the sawtooth signal is between the first reference voltage and the second reference voltage, retain the voltage level of the sawtooth signal.

In an embodiment, the sawtooth signal generator is configured to: receive a clock signal for operating the converter; and cause the voltage level of the sawtooth signal to be reset in response to the clock signal. In an embodiment, the sawtooth signal generator is configured to determine whether the voltage level of the sawtooth signal is below the first reference voltage or greater than the second reference voltage prior to causing the voltage level of the sawtooth signal to be reset.

In an embodiment, the sawtooth signal generator includes: a current source having a control terminal for receiving a control signal, an anode coupled to a voltage supply node, and a cathode coupled to a sawtooth signal output node; a capacitance having a first side coupled to the sawtooth signal output node, and a second side coupled to a ground or reference node; and a switch having a control terminal for receiving a reset signal, a first conduction terminal coupled to the sawtooth signal output node, and a second conduction terminal coupled to the ground or reference node. In an embodiment, the switch is configured to transition to an electrically conductive state in response to the assertion of the reset signal to reset the sawtooth signal to a reference voltage level.

In an embodiment, a method includes receiving a sawtooth signal generated by a sawtooth signal generation stage; comparing, by a first comparator, the sawtooth signal to a first reference voltage; comparing, by a second comparator, the sawtooth signal to a second reference voltage; in response to determining, based on comparing the sawtooth signal to the first reference voltage, that the sawtooth signal does not exceed the first reference voltage, causing a voltage level of the sawtooth signal to increase; and in response to determining, based on comparing the sawtooth signal to the second reference voltage, that the sawtooth signal exceeds the second reference voltage, causing the voltage level of the sawtooth signal to decrease.

In an embodiment, a method includes supplying, by a current source of the sawtooth signal generation stage, current to charge a capacitance; and drawing the sawtooth signal from a charge on a first side of the capacitance. In an embodiment, causing the voltage level of the sawtooth signal to increase includes outputting a signal to the current source commanding the current source to increase a supply of current to the capacitance.

In an embodiment, causing the voltage level of the sawtooth signal to decrease includes outputting a signal to the current source commanding the current source to decrease a supply of current to the capacitance. In an embodiment, a method includes supplying the sawtooth signal to a controller of a converter. In an embodiment, a method includes detecting that a clock signal used to operate the converter transitioned between states; and in response to detecting that the clock signal transitioned between states, resetting the sawtooth signal to a reference voltage. In an embodiment, comparing the sawtooth signal to the first reference voltage and comparing the sawtooth signal to the second reference voltage is performed prior to resetting the sawtooth signal.

DETAILED DESCRIPTION

Figure 1:
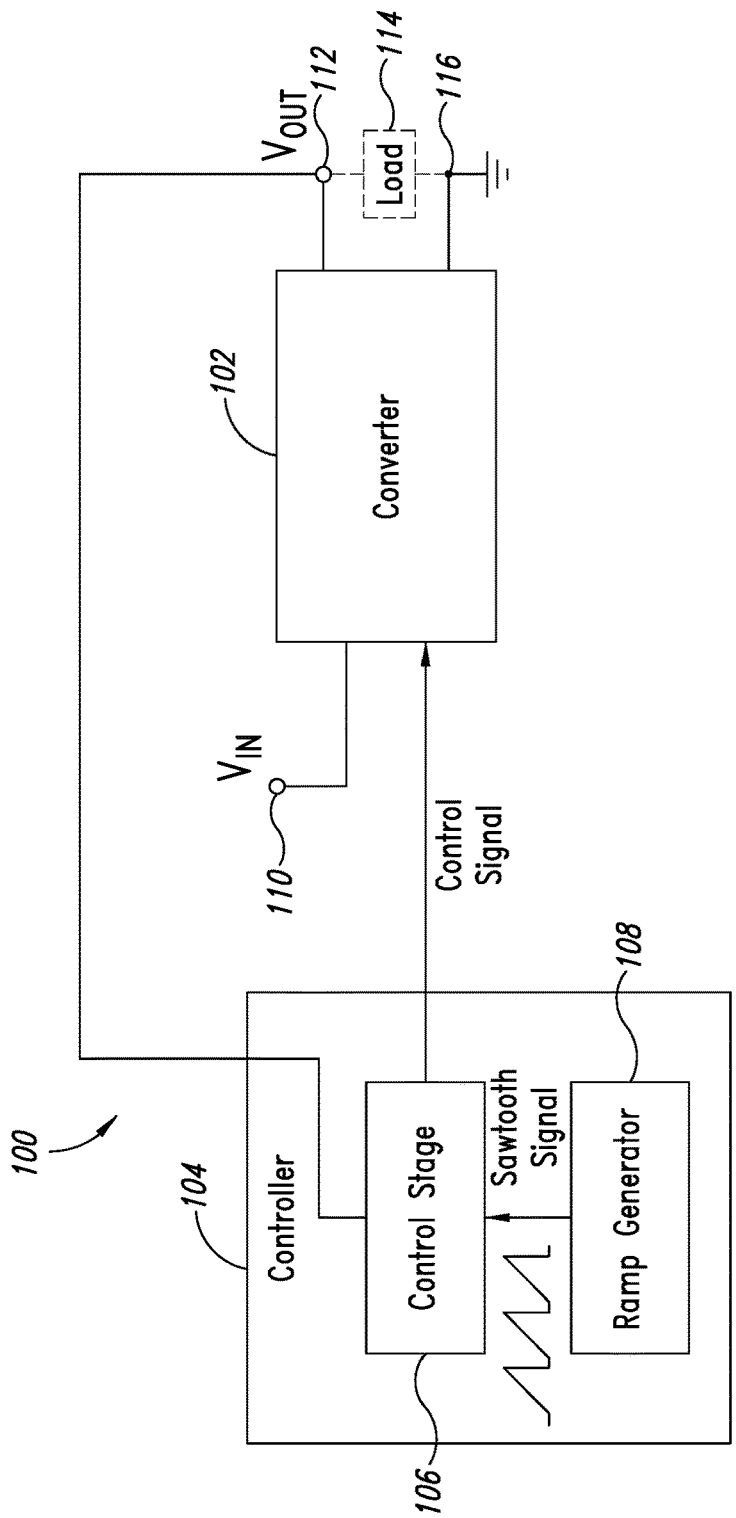
FIG. 1 shows a system for controlling a converter.

FIG. 1 shows a system 100 for controlling a converter 102. The system 100 includes the converter 102 and a controller 104. The controller 104 includes a control stage 106 and a ramp generator 108 (also referred to herein as a sawtooth signal generator). The converter 102 may be any type of system or device that receives an input voltage and a control signal and provides an output voltage based on the input voltage and the control signal. For example, the converter 102 may be a DC-DC converter. The converter 102 may also be a buck converter, a boost converter or a buck-boost converter, among others. The controller 104 may be any type of system or device that is configured to control the converter 102. For example, the controller 104 may generate the control signal and output the control signal to the converter 102. The converter 102 outputs a desired output voltage based on the control signal and the input voltage of the converter 102.

The ramp generator 108 may be any type of device configured to produce a gradually changing signal. The changing signal may be a sawtooth with a repeating ramp and return to an initial value (such as a reference voltage, ground voltage or zero voltage). The ramp generator 108 may operate using controlled capacitor charging, where a capacitor is charged to a value.

The converter 102 is coupled to an input voltage node 110 and an output voltage node 112. The converter 102 receives the control signal. The converter 102 receives an input voltage ($V_{IN}$) at the input voltage node 110. The converter 102 operates in accordance with the control signal and outputs an output voltage ($V_{OUT}$) at the output voltage node 112. The control signal may dictate switching times of switches of the converter 102, which may cause the converter 102 to output the output voltage having a desired output voltage level. The converter 102 may output the output voltage to a load 114 coupled between the output voltage node 112 and a ground node 116. The ground node 116 may generally be any reference voltage node.

The control stage 106 receives a signal representative of the output voltage. The control stage 106 also receives a sawtooth signal generated by the ramp generator 108. The control stage 106 generates the control signal based at least in part on the signal representative of the output voltage and the sawtooth signal. The control stage 106 may also generate the control signal based on a reference voltage representative of a desired output voltage level.

The accuracy of the operation of the system 100 and of the generated output voltage is also dependent on the reliability of the sawtooth signal. Variations in the sawtooth signal negatively affect the operation of the system 100. For example, variation between peak heights of the sawtooth signal over time makes the behavior of the converter 102 unstable or unpredictable. Temperature conditions as well as noise and other factors may affect the sawtooth signal. Furthermore, power supply variation as well as frequency changes may cause the peaks of the sawtooth signal to vary over time. In some applications of DC-DC converters, the frequency of the converter can be modified. The embodiments described herein ensure that the peaks of the sawtooth signal remain stable and fixed, which is of import in converters. Further, process spreads between different devices and postproduction aging or soldering may induce variations between sawtooth signals generated by different devices.

Figure 2:
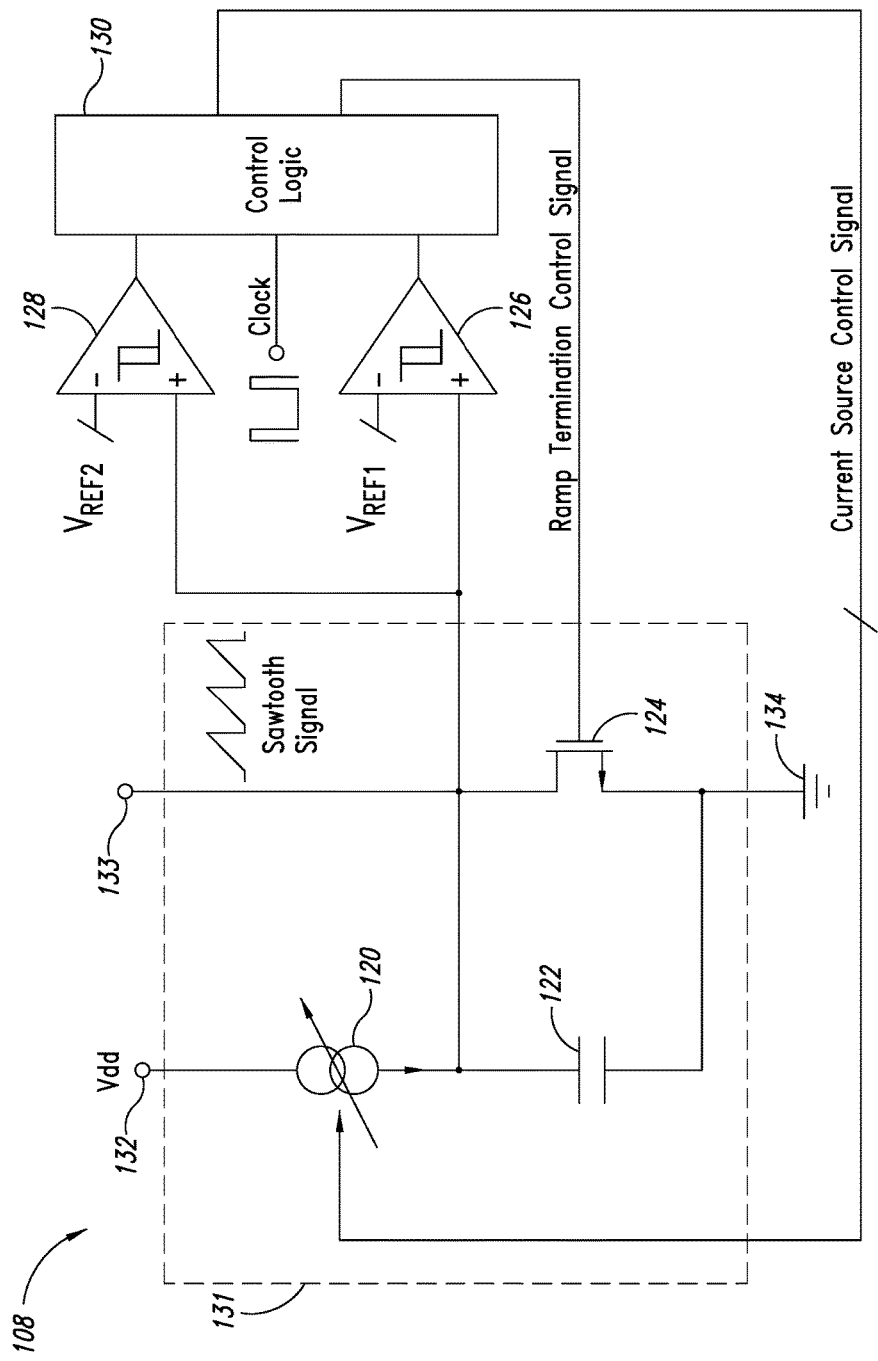
FIG. 2 shows a circuit diagram of a ramp generator.

FIG. 2 shows a circuit diagram of the ramp generator 108. The ramp generator 108 includes a current source 120, a capacitance 122, a switch 124, a first comparator 126, a second comparator 128 and control logic 130. In the ramp generator 108, the current source 120, capacitance 122, and switch 124 form a sawtooth signal generation stage 131.

The current source 120 may be a controlled current source, whereby an output current of the current source is variable and is controlled using a current source control signal provided to the current source 120. The current source 120 has an anode coupled to a voltage source node 132 and a cathode coupled to a sawtooth signal output node 133. The current source 120 also has a control terminal for receiving the current source control signal. The capacitance 122 has a first side coupled to the sawtooth signal output node 133 and a second side coupled to a ground or reference node 134.

The switch 124, which may be a transistor, is coupled in parallel with the capacitance 122 and, accordingly, has a first conduction terminal coupled to the sawtooth signal output node 133 and a second conduction terminal coupled to the ground or reference node 134. The switch 124 has a control terminal that receives a ramp termination control signal.

The first comparator 126 has a noninverting input coupled to the sawtooth signal output node 133 and an inverting input configured to receive a first reference voltage ($V_{REF1}$). The first comparator 126 has an output coupled to a first input of the control logic 130.

The second comparator 128 has a noninverting input coupled to the sawtooth signal output node 133 and an inverting input configured to receive a second reference voltage ($V_{REF2}$). The second comparator 128 has an output coupled to a second input of the control logic 130.

The control logic 130 also has a third input for receiving a clock signal. In addition, the control logic 130 has a first output for outputting the current source control signal and a second output for outputting the ramp termination control signal.

In the ramp generator 108, the output sawtooth signal is provided at the sawtooth signal output node 133. As described herein, the ramp generator 108 may be used to generate the sawtooth signal (or more generally a ramp signal) having a peak that is between the first reference voltage ($V_{REF1}$) and the second reference voltage ($V_{REF2}$). The ramp generator 108 controls the sawtooth signal to have a peak that is greater than the first reference voltage ($V_{REF1}$) and smaller than the second reference voltage ($V_{REF2}$). Accordingly, a stable and variation-resistant sawtooth signal is provided.

Initially, the current source 120 provides an output current that charges the capacitance 122. The capacitance 122 is charged over time and as time elapses and more current is supplied by the current source 120, the voltage differential across the capacitance 122 increases. As the voltage differential across the capacitance 122 increases so does the voltage level of the sawtooth signal taken at the sawtooth signal output node 133 (or the first side of the capacitance 122).

The sawtooth signal is also provided to the noninverting inputs of the first and second comparators 126, 128. The first comparator 126 compares the sawtooth signal to the first reference voltage ($V_{REF1}$). The first comparator 126 outputs a first comparison signal that is asserted when the sawtooth signal (or a voltage level thereof) meets or exceeds the first reference voltage ($V_{REF1}$). When the sawtooth signal does not exceed the first reference voltage ($V_{REF1}$), the first comparison signal may remain in the deasserted state. A signal may be asserted if the signal is activated or transitions to an active state, such as a logical one. Alternatively, a different convention may be adopted whereby deassertion, for example, the transitioning to a logical zero, of the first comparison signal is used to indicate that the sawtooth signal has met or exceeded the first reference voltage ($V_{REF1}$).

Similarly, the second comparator 128 compares the sawtooth signal to the second reference voltage ($V_{REF2}$). The second comparator 128 outputs a second comparison signal that is asserted when the sawtooth signal meets or exceeds the second reference voltage ($V_{REF2}$) and that is deasserted when the sawtooth signal does not exceed the second reference voltage ($V_{REF2}$).

The control logic 130 receives the first comparison signal and the second comparison signal. Therefore, the control logic 130 receives information indicating whether the sawtooth signal is below the first reference voltage ($V_{REF1}$), between the first reference voltage ($V_{REF1}$) and the second reference voltage ($V_{REF2}$), or greater than the second reference voltage ($V_{REF2}$).

The control logic 130 also receives a clock signal. The control logic 130 may be configured to cause the sawtooth signal to be reset or revert to a low voltage level (such as a voltage level of zero) at certain times according to the clock signal. For example, the sawtooth signal may be reset at a rising edge of the clock signal, a falling edge of the clock signal, or at any other time during the clock signal or any other signal related to the clock signal.

The control logic 130 may allow a voltage level of the sawtooth signal to increase over a duration of a clock cycle and reset the sawtooth signal at a predefined point during the clock cycle, such as the rising or falling edge of the clock signal.

To reset the clock cycle sawtooth signal, the control logic 130 asserts the ramp termination control signal. The ramp termination is provided to a control terminal of the switch 124. When the ramp termination control signal is asserted, the switch 124 transitions to the electrically conductive state, and thereby couples the first side of the capacitance 122 to the ground or reference node 134 and shorts the capacitance 122. As a result, the sawtooth signal is reset to the ground voltage of 0 Volts (V) or the reference voltage.

The control logic 130 determines, based on the first and second comparison signals, whether a peak of the sawtooth signal (observed before shorting the capacitance 122) is between the first reference voltage ($V_{REF1}$) and the second reference voltage ($V_{REF2}$), i.e., within a desired range of voltage levels.

If the control logic 130 determines that the sawtooth signal did not exceed the first reference voltage ($V_{REF1}$), the control logic 130 causes the current level output by the current source 120 to increase. The control logic 130 determines that the sawtooth signal did not exceed the first reference voltage ($V_{REF1}$) when neither the first comparison signal nor the second comparison signal is asserted.

If the control logic 130 determines that the sawtooth signal exceeded the first reference voltage ($V_{REF1}$) and remained below the second reference voltage ($V_{REF2}$), the control logic 130 retains the current level output by the current source 120. The control logic 130 determines that the sawtooth signal remained between the two reference voltage levels if the first comparison signal was asserted and the second comparison signal was not asserted.

If the control logic 130 determines that the sawtooth signal exceeded the second reference voltage ($V_{REF2}$), the control logic 130 causes the current level output by the current source 120 to decrease. The control logic 130 determines that the sawtooth signal exceeded the second reference voltage ($V_{REF2}$) when both the first and second comparison signals get asserted.

The current source control signal may indicate a desired output current level of the current source 120 and may command the current source 120 to output the desired current level. For example, the current source control signal may be a multi-bit or multilevel control signal, whereby each bit or level may be used to indicate a unique output current level of the current source 120. The output current level of the current source 120 may be "stepped-up" or "stepped-down" using the current source control signal. For example, if the current source control signal is incremented, the output current level of the current source 120 may be increased or "stepped-up," and if the current source control signal is decremented, the output current level of the current source 120 may be decreased or "stepped-down." Retaining the current source control signal without changing its level causes the output current level of the current source 120 to be retained without change.

Changing the current source 120 output current level causes the slope of the sawtooth signal (or ramp) to change. When the output current level is increased, the voltage level of the sawtooth signal increases at a faster rate, thereby reaching a particular voltage level in a shorter period of time. Conversely, decreasing the output current level reduces the rate at which the voltage level of the sawtooth signal climbs, and the particular voltage level is reached after a longer period of time. Thus, if the sawtooth signal is reset at equal intervals, adjusting the output current level in effect adjusts the peak voltage levels of the sawtooth signal.

Figure 3A:
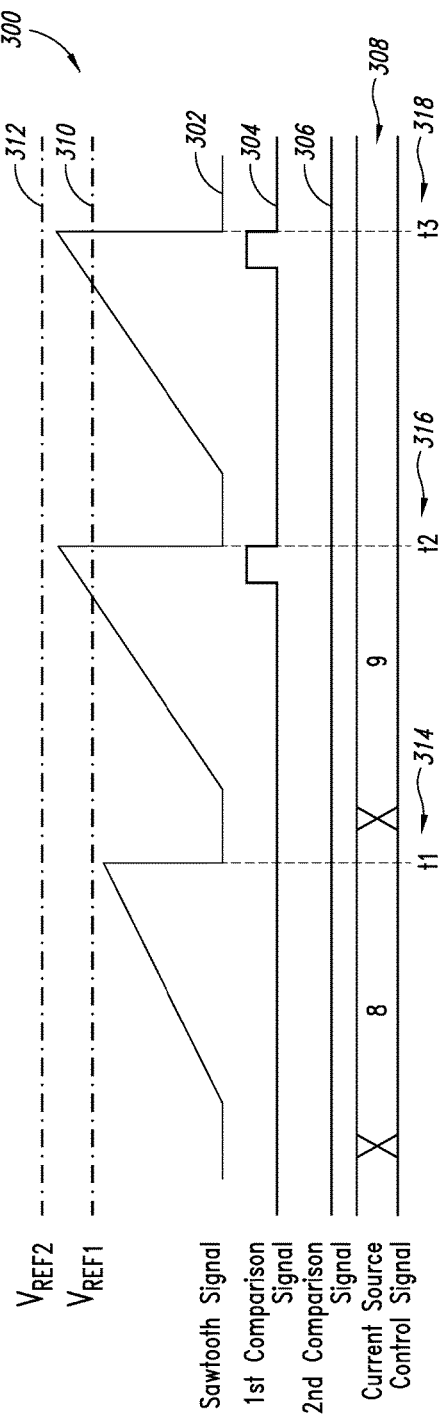
FIGS. 3A and 3B show timing diagrams of signals of the ramp generator described with reference to FIG. 1.
Figure 3B:
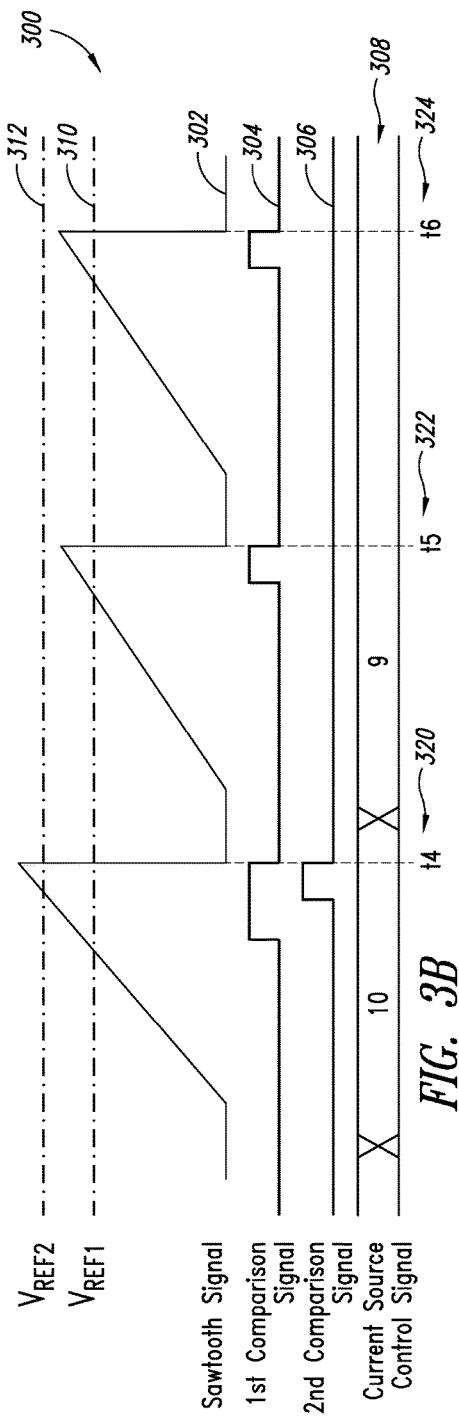

FIGS. 3A and 3B show timing diagrams 300 of signals of the ramp generator 108 described with reference to FIG. 1. The timing diagram 300 shows the sawtooth signal 302, the first comparison signal 304, the second comparison signal 306 and the current source control signal 308. In addition, the timing diagram 300 shows the first reference voltage 310 and the second reference voltage 312.

In FIG. 3A, the sawtooth signal 302 initially increases over time and is reset at a first time instance 314. The control logic 130 determines whether the first comparison signal 304 and the second comparison signal 306 were asserted before the sawtooth signal 302 is reset to the reference voltage level. Because the first comparison signal 304 was not asserted, it may be concluded that the sawtooth signal 302 fell short of the first reference voltage 310. Accordingly, the control logic 130 causes the output current of the current source 120 to increase. The control logic 130, in this example, increments a level of the current source control signal 308 from eight to nine.

Between the first time instance 314 and a second time instance 316, the capacitance 122 is charged again. The sawtooth signal 302 reaches a peak current level before the sawtooth signal 302 is reset at the second time instance 316. The control logic 130 determines that the first comparison signal 304 was asserted and the second comparison signal 306 was not asserted. Accordingly, the sawtooth signal 302 reached a peak between the first and second reference voltages 310, 312. The control logic 130 retains the current source control signal at its prior level. Similarly, when a third time instance 318 is reached, the sawtooth signal 302 reaches a peak between the first and second reference voltages 310, 312. Accordingly, the control logic retains without change the current source control signal.

In FIG. 3B, initially the current source control signal 308 has a level of ten. A voltage level of the sawtooth signal 302 increases until the sawtooth signal 302 is reset at a fourth time instance 320. The peak voltage level of the sawtooth signal 302 reached prior to the resetting exceeds the second reference voltage 312. As a result, the second comparison signal 306 (as well as the first comparison signal 304) is asserted. Assertion of the second comparison signal 306 is indicative that the output current of the current source 120 is too elevated. The control logic 130 decrements the current source control signal 308 in order to reduce the output current level of the current source 120.

Accordingly, between the fourth time instance 320 and a fifth time instance 322, the peak voltage level of the sawtooth signal 302 drops below the second reference voltage 312 and remains above the first reference voltage 310. In response, the control logic 130 does not alter the state of the current source control signal 308. Similarly, the control logic 130 retains a state of the current source control signal 308 after a sixth time instance 324 in response to the sawtooth signal 302 falling between the two reference voltages 310, 312.

Figure 4:
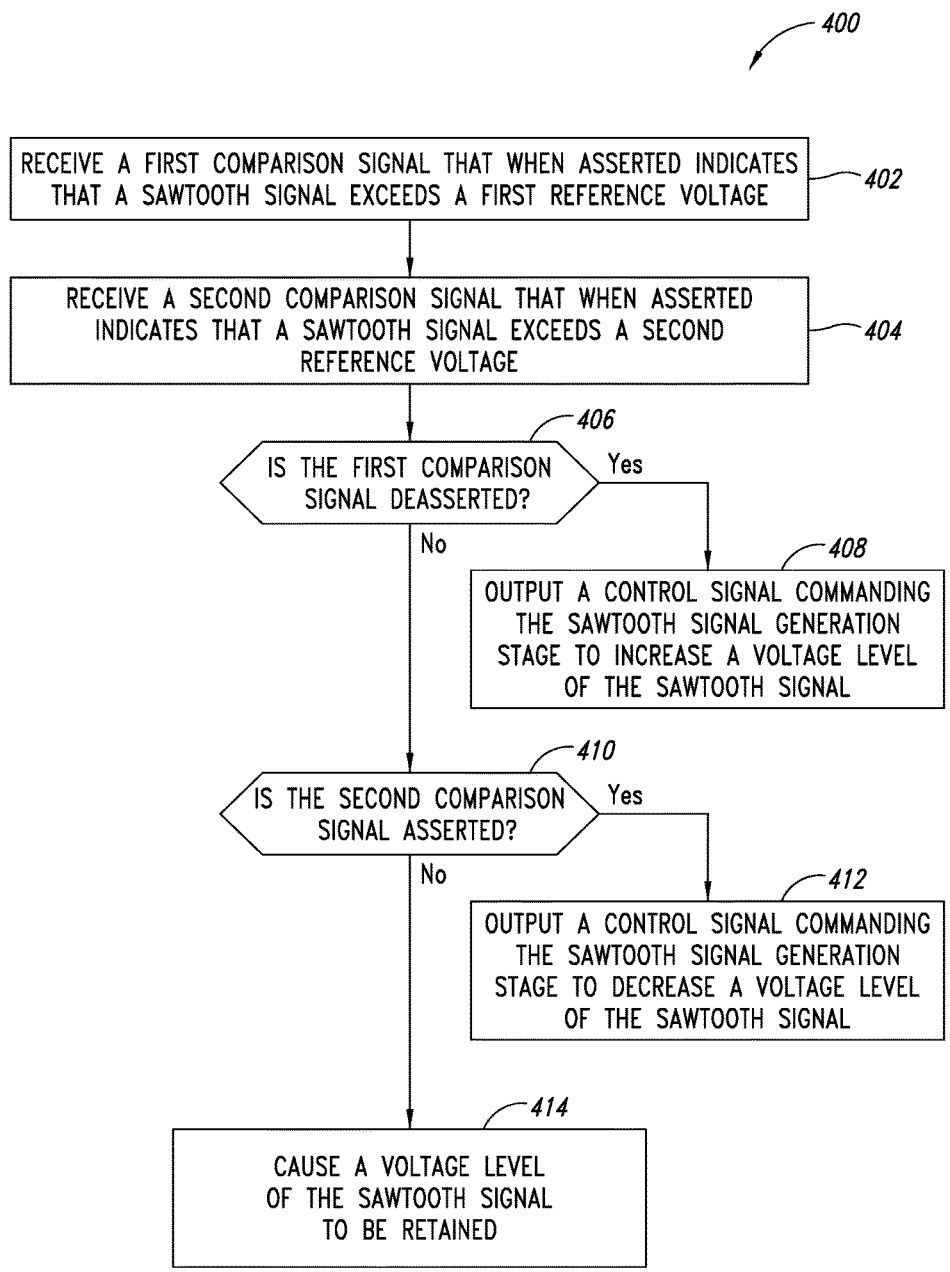
FIG. 4 shows a flow diagram of a method for operating control logic of the ramp generator in accordance with an embodiment.

FIG. 4 shows a flow diagram of a method 400 for operating the control logic 130 in accordance with an embodiment. The method 400 may be implemented using circuitry, such as a hardware circuit, or a controller, such as a processor, microprocessor or microcontroller, among others. For example, the control logic 130 may be a circuit, such as a digital circuit, or an external controller.

In the method 400, the control logic 130 receives, at 402, a first comparison signal that when asserted indicates that a sawtooth signal exceeds a first reference voltage. The control logic 130, at 404, receives a second comparison signal that when asserted indicates that the sawtooth signal exceeds a second reference voltage. The control logic 130, at 406, determines whether the first comparison signal is deasserted. If a positive determination is made at 406, at 408 the control logic 130 outputs a control signal commanding a sawtooth signal generation stage to increase a voltage level of the sawtooth signal. Examples of the control signal include the control signal 308 described with reference to FIG. 3. For example, the control logic 130 may increase a level of the control signal, which may be a multi-bit signal. The control logic 130 may increase a level of the control signal to warn that the voltage level of the sawtooth signal has to be increased. As described herein, a current source of the sawtooth signal generation stage may receive the control signal and correspondingly increase its output current level. Increasing the output current level causes the voltage level of the sawtooth signal to increase.

If a negative determination is made at 406, it may be concluded that the voltage level of the sawtooth signal exceeds the first reference voltage. Depending on whether the voltage level of the sawtooth signal exceeds the second reference voltage or not, the control logic 130 may decrease or retain the voltage level of the sawtooth signal.

If a negative determination is made at 406, the method 400 proceeds to determining whether the second comparison signal is asserted at 410. If a positive determination is made at 410, the control logic, at 412, outputs of the control signal commanding the sawtooth signal generation stage to decrease the voltage level of the sawtooth signal. For example, the control logic 130 may decrease a level of the control signal. If a negative determination is made at 410, the control logic 130, at 414, causes the voltage level of the sawtooth signal to be retained. The control logic 130 may cause the voltage level of the sawtooth signal to be retained by retaining the level of the control signal at its present level. The method 400 may be continuously repeated cycle-by-cycle. After 408, 412 or 414, the method 400 may revert to 402.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sawtooth signal generator, comprising:
    a sawtooth signal generation stage including a current source, the sawtooth signal generation stage configured to:

receive a control signal; and
generate a sawtooth signal based on the control signal, the sawtooth signal having a peak voltage and a minimum voltage;
a first comparator configured to:
receive a first reference voltage, the first reference voltage being greater than the minimum voltage;
receive the sawtooth signal;
compare the peak voltage of the sawtooth signal with the first reference voltage; and
output a first comparison signal that is asserted when the peak voltage of the sawtooth signal exceeds the first reference voltage and deasserted when the peak voltage of the sawtooth signal does not exceed the first reference voltage;
a second comparator configured to:
receive a second reference voltage, the second reference voltage being greater than the first reference voltage;
receive the sawtooth signal;
compare the peak voltage of the sawtooth signal with the second reference voltage; and
output a second comparison signal that is asserted when the peak voltage of the sawtooth signal exceeds the second reference voltage and deasserted when the peak voltage of the sawtooth signal does not exceed the second reference voltage;
control logic configured to:
receive the first and second comparison signals;
determine whether the first comparison signal is deasserted;
in response to determining that the first comparison signal is deasserted, output the control signal to the sawtooth signal generation stage to increase a slope of the sawtooth signal using the current source;
determine whether the second comparison signal is asserted; and
in response to determining that the second comparison signal is asserted, output the control signal to the sawtooth signal generation stage to decrease the slope of the sawtooth signal using the current source; and
the sawtooth signal generation stage further configured to:
in response to the control signal output from the control logic, increasing or decreasing the current source to output the peak voltage of the sawtooth signal between the first reference voltage and the second reference voltage.

2. The sawtooth signal generator of claim 1, wherein the sawtooth signal generation stage includes:
the current source having a control terminal configured to receive the control signal, an anode coupled to a voltage supply node and a cathode coupled a sawtooth signal output node;
a capacitance having a first side coupled to the output of the sawtooth signal output node and a second side coupled to a reference node; and
a switch having a control terminal configured to receive a reset signal, a first conduction terminal coupled to the sawtooth signal output node, and a second conduction terminal coupled to the reference node.

3. The sawtooth signal generator of claim 2, wherein the current source is configured to:
receive the control signal; and
adjust an output current provided at the cathode based on the control signal.

4. The sawtooth signal generator of claim 2, wherein the control logic is configured to:
receive a clock signal; and
output the reset signal based on the clock signal, the reset signal when activated causes the switch to close and reset the sawtooth signal to a reference voltage of the reference node.

5. The sawtooth signal generator of claim 1, wherein the control logic is configured to:
determine that the first comparison signal is asserted and the second comparison signal is deasserted; and
in response to determining that the first comparison signal is asserted and the second comparison signal is deasserted, output the control signal commanding the sawtooth signal generation stage to retain the slope of the sawtooth signal.

6. The sawtooth signal generator of claim 1, wherein increasing the slope of the sawtooth signal increases the peak voltage of the sawtooth signal and decreasing the slope of the sawtooth signal decreases the peak voltage of the sawtooth signal.

7. A controller for a converter, comprising:
a switching stage configured to:
receive a feedback voltage indicative of an output voltage of the converter, and a sawtooth signal, the sawtooth signal having a peak voltage and a minimum voltage;
generate a control signal based on the feedback voltage and the sawtooth signal; and
output the control signal for driving the converter; and
a sawtooth signal generator configured to:
receive a first reference voltage and a second reference voltage, the first reference voltage being greater than the minimum voltage and the second reference voltage being greater than the first reference voltage;
determine whether the peak voltage of the sawtooth signal is less than the first reference voltage or greater than the second reference voltage;
in response to determining the peak voltage is below the first reference voltage, increase a current source to output the peak voltage of the sawtooth signal between the first reference voltage and the second reference voltage; and
in response to determining the peak voltage is greater than the second reference voltage, decrease the current source to output the peak voltage of the sawtooth signal between the first reference voltage and the second reference voltage.

8. The controller of claim 7, wherein the sawtooth signal generator is configured to:
receive a clock signal for operating the converter; and
cause a voltage level of the sawtooth signal to be reset in response to the clock signal.

9. The controller of claim 8, wherein the sawtooth signal generator is configured to determine whether the voltage level of the sawtooth signal is below the first reference voltage or greater than the second reference voltage prior to causing the voltage level of the sawtooth signal to be reset.

10. The controller of claim 7, wherein the
current source has a control terminal, an anode coupled to a voltage supply node, and a cathode coupled to a sawtooth signal output node, wherein the sawtooth signal generator further includes:
a capacitance having a first side coupled to the sawtooth signal output node, and a second side coupled to a reference node; and a switch having a control terminal for receiving a reset signal, a first conduction terminal coupled to the sawtooth signal output node, and a second conduction terminal coupled to the reference node.

11. The controller of claim 10, wherein the switch is configured to transition to an electrically conductive state in response to assertion of the reset signal to reset the sawtooth signal to a reference voltage level.

12. A method, comprising:
receiving a sawtooth signal from a sawtooth signal generation stage;
maintaining a peak voltage of the sawtooth signal between a first reference voltage and a second reference voltage, the sawtooth signal having a minimum voltage, the first reference voltage being greater than the minimum voltage, the maintaining including:
comparing, by a first comparator, the sawtooth signal to the first reference voltage;
outputting a first control signal in response to the sawtooth signal being less than the first reference voltage;
comparing, by a second comparator, the sawtooth signal to the second reference voltage;
outputting a second control signal in response to the sawtooth signal being greater than the second reference voltage;
increasing the peak voltage in response to the first control signal; and
decreasing the peak voltage in response to the second control signal.

13. The method of claim 12, comprising:
supplying, by a current source of the sawtooth signal generation stage, current to charge a capacitance; and
drawing the sawtooth signal from a charge on a first side of the capacitance.

14. The method of claim 13, comprising:
receiving, by the current source, a digital multibit signal; and
increasing or decreasing, by the current source, a supply of current to the capacitance based on the digital multibit signal.

15. The method of claim 14, wherein the digital multibit signal has a digital value representative of a level of the current supplied by the current source to charge the capacitance.

16. The method of claim 12, comprising:
supplying the sawtooth signal to a controller of a converter.

17. The method of claim 16, comprising:
detecting that a clock signal used to operate the converter transitioned between states; and
in response to detecting that the clock signal transitioned between states, resetting the sawtooth signal to a reference voltage.

18. The method of claim 17, wherein comparing the sawtooth signal to the first reference voltage and comparing the sawtooth signal to the second reference voltage is performed prior to resetting the sawtooth signal.

* * * * *